United States Patent
Turgeon et al.

(10) Patent No.: US 9,504,183 B2
(45) Date of Patent: Nov. 22, 2016

(54) HYBRID THERMAL MANAGEMENT OF ELECTRONIC DEVICE

(71) Applicant: Accedian Networks Inc., Saint-Laurent (CA)

(72) Inventors: Guillaume Turgeon, Laval (CA); Marcel Chanu, Lachine (CA)

(73) Assignee: Accedian Networks Inc., Saint Laurent (CA)

(*) Notice: Subject to any disclaimer, the term of this patent is extended or adjusted under 35 U.S.C. 154(b) by 113 days.

(21) Appl. No.: 14/548,366

(22) Filed: Nov. 20, 2014

(65) Prior Publication Data

US 2016/0150676 A1    May 26, 2016

(51) Int. Cl.
*H05K 7/20*    (2006.01)

(52) U.S. Cl.
CPC ....... *H05K 7/20154* (2013.01); *H05K 7/20563* (2013.01); *H05K 7/20727* (2013.01)

(58) Field of Classification Search
CPC ............ H05K 7/20136; H05K 7/20154; H05K 7/20163; H05K 7/20172; H05K 7/20554; H05K 7/20563; H05K 7/20581; H05K 7/20718; H05K 7/20727; H05K 7/20736; G06F 1/20; G06F 2200/201
USPC ....... 361/695–697, 679.49–679.51; 454/184; 312/236
See application file for complete search history.

(56) References Cited

U.S. PATENT DOCUMENTS

| | | | | |
|---|---|---|---|---|
| 6,459,578 B1* | 10/2002 | Wagner | ............ | H05K 7/20145 165/104.33 |
| 6,466,441 B1* | 10/2002 | Suzuki | ............ | H05K 7/20154 165/104.33 |
| 6,678,157 B1* | 1/2004 | Bestwick | ............ | G06F 1/20 165/104.34 |
| 6,842,340 B2* | 1/2005 | Chang | ............ | H01L 23/4093 165/80.3 |
| 7,457,114 B2* | 11/2008 | Peng | ............ | G06F 1/20 165/80.3 |
| 2011/0247787 A1* | 10/2011 | Liu | ............ | G06F 1/20 165/104.28 |

* cited by examiner

*Primary Examiner* — Zachary M Pape
(74) *Attorney, Agent, or Firm* — Nixon Peabody LLP

(57) ABSTRACT

An enclosure with hybrid thermal management for a heat-generating electronic device comprises a passive heat sink for conducting heat away from the electronic device, a cold skin adapted to slide over the top of the passive heat sink and having a front wall forming a plurality of air intake ports, and a plurality of blowers mounted inside the cold skin for drawing air into the cold skin though the air intake ports and then directing the air through the passive heat sink. In one implementation, the passive heat exchanger includes multiple thermally conductive fins adjacent to the electronic device and extending rearwardly from the intake ports, the fins being spaced apart from each other for conducting heat away from the electronic device. The blowers preferably direct air rearwardly from the intake ports in the front wall into the spaces between the thermally conductive fins.

7 Claims, 5 Drawing Sheets

HYBRID THERMAL MANAGEMENT OF ELECTRONIC DEVICE

FIELD OF THE INVENTION

The present disclosure relates to hybrid thermal management of electronic devices, specifically the cooling of transceivers, such as a small form-factor pluggable (SFP) transceiver.

BRIEF SUMMARY

In accordance with one embodiment, an enclosure with hybrid thermal management for a heat-generating electronic device comprises a passive heat sink for conducting heat away from the electronic device, a cold skin adapted to slide over the top of the passive heat sink and having a front wall forming a plurality of air intake ports, and a plurality of blowers mounted inside the cold skin for drawing air into the cold skin though the air intake ports and then directing the air through the passive heat sink. In one implementation, the passive heat exchanger includes multiple thermally conductive fins adjacent to the electronic device and extending rearwardly from the intake ports, the fins being spaced apart from each other for conducting heat away from the electronic device. The blowers preferably direct air rearwardly from the intake ports in the front wall into the spaces between the thermally conductive fins, with air being exhausted from the enclosure through exhaust ports formed in the rear wall of the passive heat sink.

The thermally conductive fins preferably extend vertically along the air intake ports and above the intake ports, with the portions of the fins above the air intake ports being spaced rearwardly away from the intake ports to form a space for receiving the blowers inside the cold skin. The passive heat sink preferably includes side walls forming a space below the fins for receiving the heat-generating electronic device, and a front wall closing the spaces below the fins and adapted to transmit signals to the electronic device in the space, such as optical ports to transmit optical signals to the electronic device. The electronic device may comprise a transceiver, such as an SFP. A controller may be coupled to the blowers for adjusting the speed of the blowers based on the temperature in the enclosure.

The foregoing and additional aspects and embodiments of the present disclosure will be apparent to those of ordinary skill in the art in view of the detailed description of various embodiments and/or aspects, which is made with reference to the drawings, a brief description of which is provided next.

BRIEF DESCRIPTION OF THE DRAWINGS

The foregoing and other advantages of the disclosure will become apparent upon reading the following detailed description and upon reference to the drawings.

Figure 1:
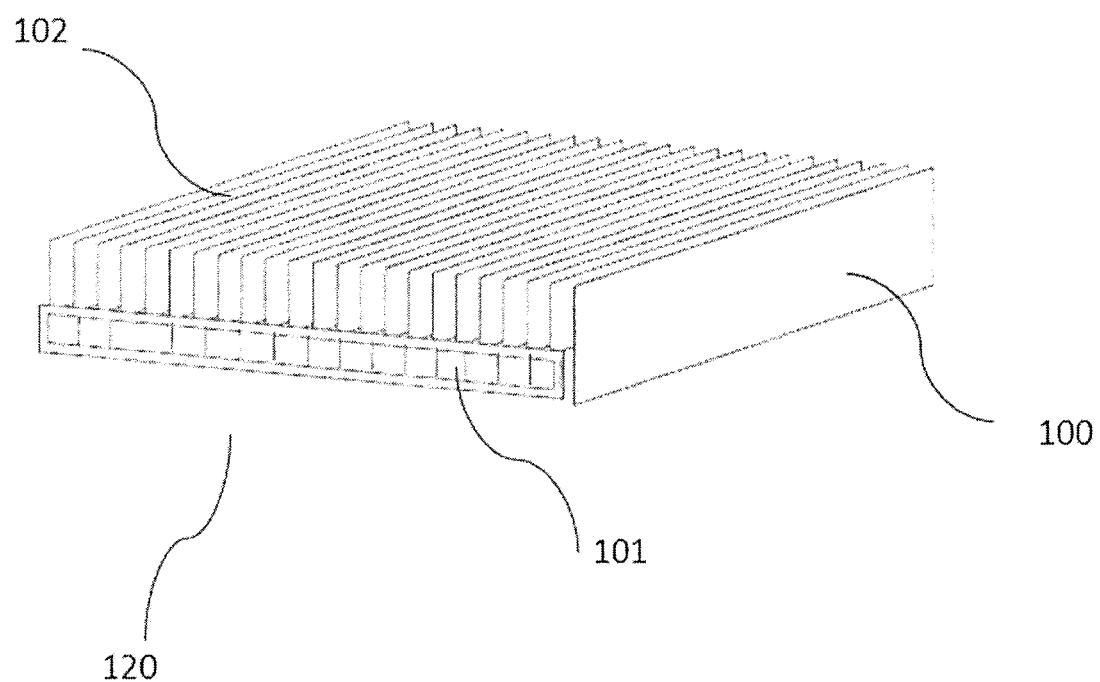
FIG. 1 is the front perspective of a prior art example of an enclosure.

While the present disclosure is susceptible to various modifications and alternative forms, specific embodiments or implementations have been shown by way of example in the drawings and will be described in detail herein. It should be understood, however, that the disclosure is not intended to be limited to the particular forms disclosed. Rather, the disclosure is to cover all modifications, equivalents, and alternatives falling within the spirit and scope of an invention as defined by the appended claims.

DETAILED DESCRIPTION

During operations, electronic devices generate heat which may cause the device to overheat and damage itself. Heat sinks, located near the electronic components or surrounding the electronic components as an enclosure, transfer the thermal energy from a high temperature device to a lower temperature medium, such as air or water, either actively or passively. The passive heat sink dissipates the hot air to a surrounding medium through convection and/or conduction. The active heat sinks use powered blowers or fans, to dissipate the heat and cool the device.

Existing heat sinks use passive or active thermal management, but not both. Some dissipation methods contain the air within the enclosure, which potentially causes dust contamination. Filters within the enclosure help prevent contamination, when air remains in the enclosure. Existing heat sinks also renew oxygen within the enclosure, which causes potential fire hazards.

There is a need for an enclosure for electronic devices, which provides a hybrid thermal solution, consistently using both passive and active thermal management, the workload of each solution being dependent on the device's temperature. The solution needs to include dust control by use of moving air to outside of the enclosure and device. When air moves outside the enclosure, the lack of oxygen renewal minimizes the threat of a fire, as necessary for Network Equipment Building System (NEBS) fire certification. The hybrid use of passive and active thermal management provides optimized cooling in a low cost and high reliability manner.

FIG. 1 shows an example prior art enclosure 100. The enclosure generally comprises a plurality of electrical components (not shown). This embodiment is described in terms of an enclosure 100, comprising a plurality of transceivers (not shown) which have one or more optical ports 101 for connecting to other networking devices. The enclosure further comprises a plurality of fins 102 for passive heat exchange by way of convection. Generally, these devices are rack mounted, and therefore it is desirable to access the interface from the front 120 for actions such as maintenance and configuration.

The fins 102 form a passive heat sink, to dissipate heat from internal electrical components, such as transceivers, while the ambient air flows through the fins.

Active heat sinks generally connect to one or more electronic devices. In this embodiment, the active heat sink is placed above passive heat sinks which, in this example, are the fins of the enclosure 100. The active heat sink, comprising fans or blowers, slide on top of passive heat sink enclosures of the electronic devices. They are referred to as cold skins. A cold skin is a secondary active heat sink enclosure which affixes to a passive heat sink enclosure, and connects to one or more of the electronic devices within the passive heat sink enclosure. The plurality of fans or blowers in the cold skin assist the passive heat sink in the cooling of the electronic components. The simultaneous use of a cold skin and a passive heat sink as per this embodiment, is referred to as a hybrid thermal solution.

Figure 2:
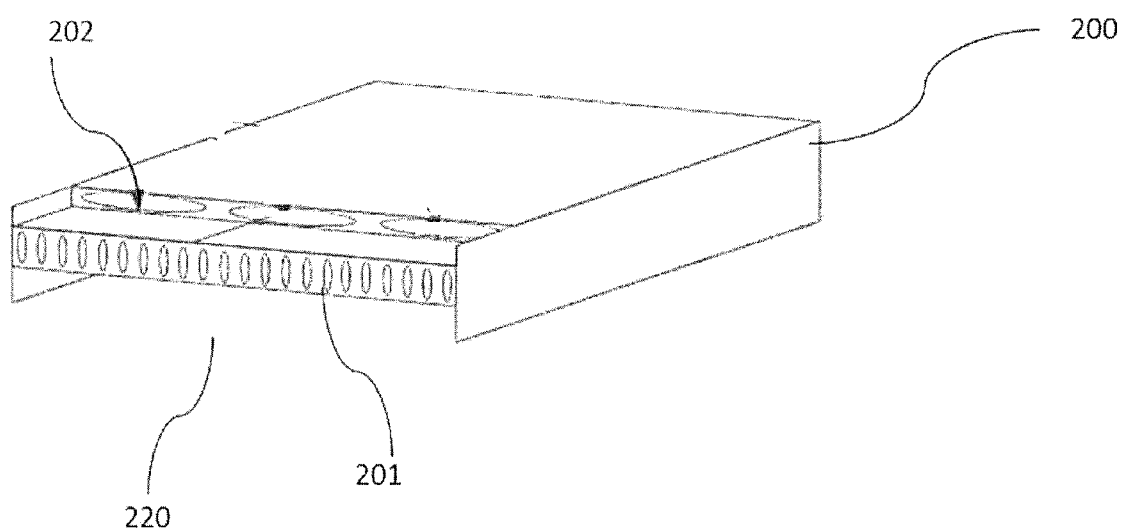
FIG. 2 is a front perspective example of a cold skin

FIG. 2 is a front view of an embodiment of a cold skin 200, with front access 220, wherein once affixed to the enclosure 100, with fin-based passive heat exchange, air can flow through a plurality of air intakes 201 at the front of the cold skin 200, such that low profile blowers (not shown) 202 can dissipate the heat out the back of the enclosure 100.

Figure 3:
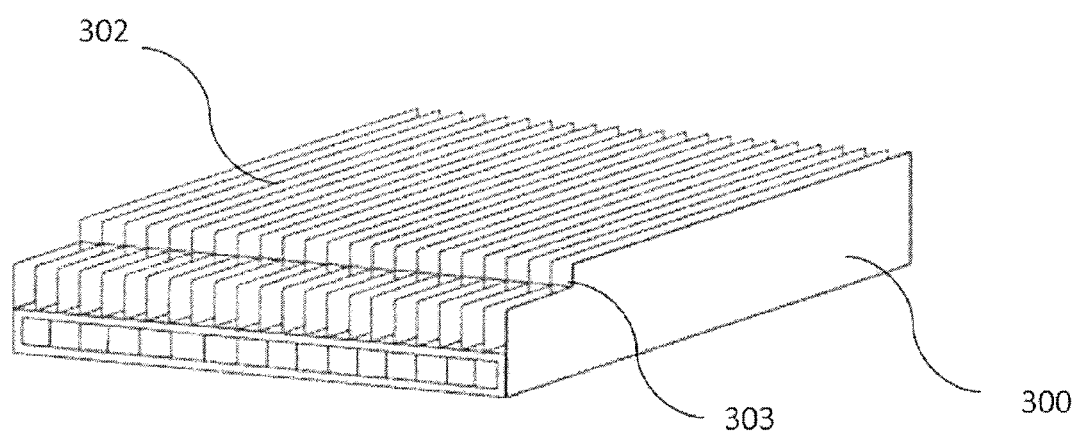
FIG. 3 is a front perspective example of a single base unit enclosure with a custom step in the fins to affix a custom cold skin.

FIG. 3 shows a different enclosure 300, comprising a custom design of the fins 302. A section is cut from the plurality of fins 302, forming a 'step' 303 which allows a custom cold skin 200 with a flat surface to affix to the top of the enclosure 300, wherein the blowers 202 face downwards on top of the removed section of fins 302, allowing for easier placement in a rack-mounted environment. This embodiment can also be applied to any rack-mounted size enclosure, such as 1 U, 2 U, and 4 U.

Figure 4:
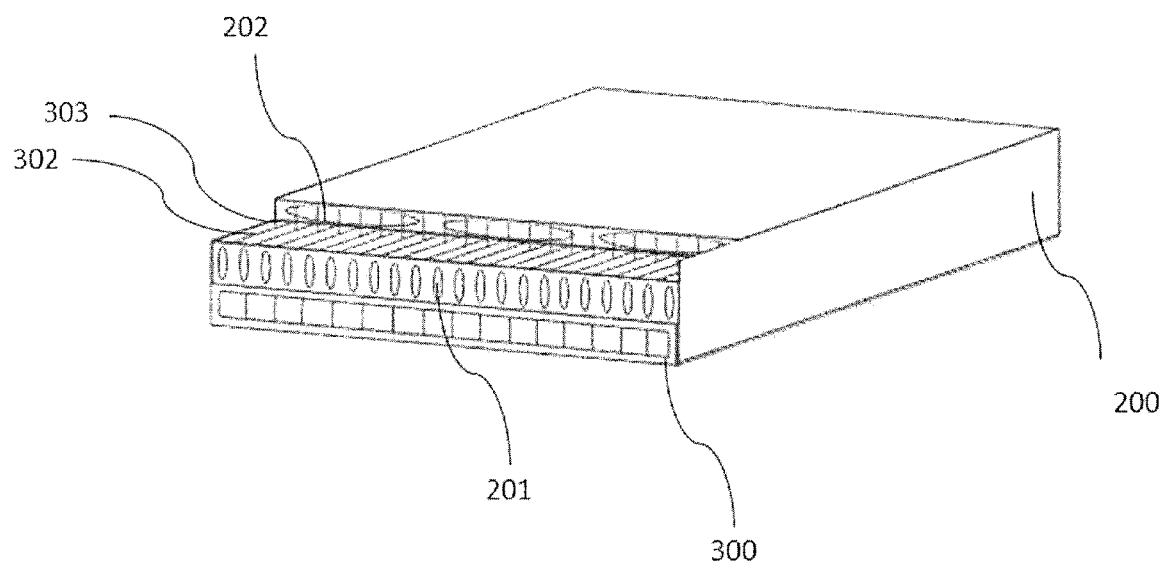
FIG. 4 is a partial unit perspective, with the cold skin affixed to the enclosure of FIG. 3.

FIG. 4 shows the cold skin 200 after it affixes to the top of the enclosure 300, which may vary in form, where the custom step 303 allows the cold skin 200 to slide on top of the enclosure 300, to maintain a flat surface, and the blowers (not shown) 202 sit face-down directly on the top of the fins 302.

Figure 5:
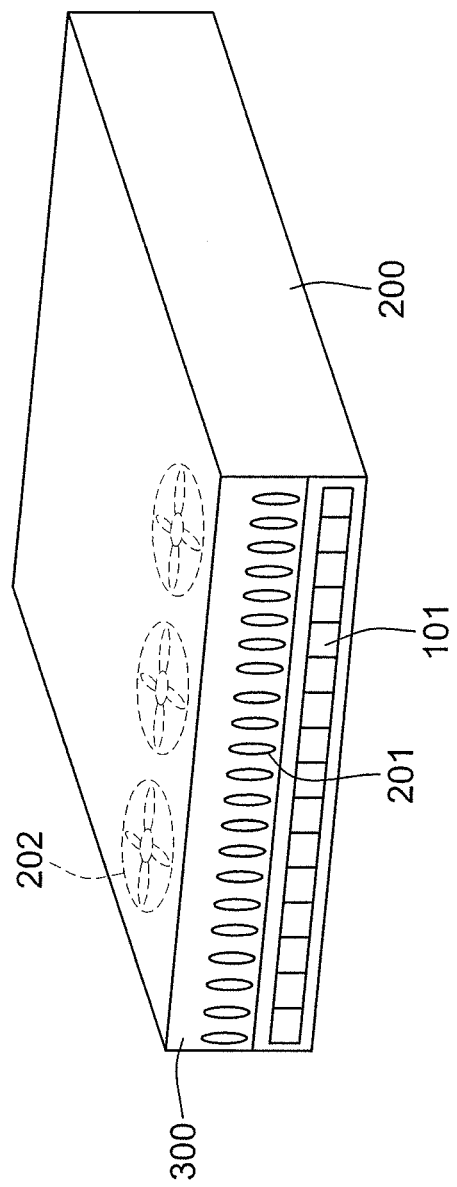
FIG. 5 is a full closed unit perspective of the cold skin affixed to the enclosure.

FIG. 5 shows a closed view of the cold skin 200 affixed to the enclosure 300, wherein ambient air passes through the plurality of air intakes 201, where the fins 302 use convection to raise the heat to the top of the enclosure 300, while remaining air flows through the fins 302 and out the back of the enclosure 300 as the blowers 202 of the cold skin 200 actively cool the heat and push the resulting air outside the enclosure 300 through the back. The blowers 202, attached to the cold skin 200, lie face-down at the front of the enclosure 300. The ambient air exiting the back of the blowers 202 also cools the back portion of the enclosure 300 before leaving the enclosure 300 through the back.

Generally, the blowers 202 are always on for hybrid thermal management, as the cold skin 200 prevents passive-only heat dissipation. Optionally, the cold skin 200 may connect to the enclosure 300, where thermal sensors in the enclosure 300 may trigger the blowers 202 to change speed based on the operating temperature of the device.

While particular implementations and applications of the present disclosure have been illustrated and described, it is to be understood that the present disclosure is not limited to the precise construction and compositions disclosed herein and that various modifications, changes, and variations can be apparent from the foregoing descriptions without departing from the spirit and scope of an invention as defined in the appended claims.

What is claimed is:

1. An enclosure with hybrid thermal management for a heat-generating electronic device, said enclosure comprising
    a passive heat sink, comprising multiple thermally conductive fins adjacent to said electronic device and extending rearwardly from said intake ports, said fins being spaced apart from each other for conducting heat away from said electronic device,
    a cold skin adapted to slide over the top of said passive heat sink and having a front wall forming a plurality of air intake ports,
    a plurality of blowers mounted inside said cold skin for drawing air into said cold skin though said air intake ports and then directing said air through said passive heat sink; and
    wherein said thermally conductive fins extend vertically along said air intake ports and above said intake ports, the portions of said fins above said air intake ports being spaced rearwardly away from said intake ports to form a space for receiving said blowers inside said cold skin.

2. The enclosure of claim 1 in which said blowers direct air from said intake ports into said spaces between said thermally conductive fins.

3. The enclosure of claim 1 in which said passive heat sink includes side walls forming a space below said fins for receiving said heat-generating electronic device.

4. The enclosure of claim 1 in which said electronic device includes optical ports to transmit optical signals.

5. The enclosure of claim 1 which includes a controller coupled to said blowers for adjusting the speed of said blowers based on the temperature in said enclosure.

6. The enclosure of claim 1 in which said electronic device comprises a transceiver.

7. The enclosure of claim 6 in which said transceiver is an SFP.

* * * * *